United States Patent [19]

Shelley

[11] 4,345,204
[45] Aug. 17, 1982

[54] BRIDGELESS DIELECTRIC MEASUREMENT

[75] Inventor: Donald L. Shelley, Millersville, Pa.

[73] Assignee: Armstrong World Industries, Inc., Lancaster, Pa.

[21] Appl. No.: 198,974

[22] Filed: Oct. 20, 1980

[51] Int. Cl.³ .............................................. G01R 27/26
[52] U.S. Cl. ................................................... 324/61 R
[58] Field of Search ............................ 324/61 R, 60 C

[56] References Cited

U.S. PATENT DOCUMENTS

| | | | |
|---|---|---|---|
| 1,905,349 | 4/1933 | Edwards et al. | 324/60 C |
| 2,906,948 | 9/1959 | Shawhan | 324/60 R |
| 3,378,765 | 4/1968 | Hilsenrath et al. | 324/60 R |
| 3,525,935 | 8/1970 | Cho | 324/61 R |
| 3,546,595 | 12/1970 | Blakely, Jr. | 324/61 R X |
| 3,668,523 | 6/1972 | Kuhn | 324/158 D |
| 3,753,373 | 8/1973 | Brown | 324/61 R X |
| 3,816,811 | 6/1974 | Cmelik | 324/61 R |
| 4,058,766 | 11/1977 | Vogel et al. | 324/61 R |
| 4,096,758 | 6/1978 | Moore | 324/61 R X |

FOREIGN PATENT DOCUMENTS 143114  7/1980  German Democratic Rep. ... 324/61R

Primary Examiner—Stanley T. Krawczewicz

[57] ABSTRACT

An apparatus for measurement of dielectric properties at very low frequencies without the use of bridge circuits. A high quality capacitor of high capacitance value is placed in series with the sample to be tested and the voltage displayed across the capacitor is read by use of a very high input impedance amplifier. With the proper selection of component values, taking into account stray capacitances and leakage resistance, the result is an extremely stable measurement circuit for frequencies below 10 Hertz with capability of being easily automated for unattended operation.

7 Claims, 2 Drawing Figures

BRIDGELESS DIELECTRIC MEASUREMENT

SUMMARY OF THE INVENTION

The established means for measuring dielectric properties of insulating materials at low frequencies is by the use of bridge circuits. However, despite reasonably satisfactory results in the range of interest of frequencies lower than 10 Hertz for isolated measurements, the requirement of time consuming nulling procedures with bridge circuits makes the possibility of automating such measuring techniques extremely difficult. The use of a bridge circuit essentially requires the adjustment of some parameters, usually an impedance, until a voltage indicator, such as a meter, or, in the newer more sophisticated instruments, combinations of amplifiers and meters, shows no voltage. Such a manipulation until no signal is detected is usually done by the operator, and, while it is conceivable to automate such actions by the use of feedback systems, the complexity, cost and unreliability of such a system leads to difficulties.

Moreover, most bridge circuits suffer from microphonics and other noise problems which require drastic filtering slowing response time to changes in test parameters.

The present invention has solved these problems by the use of a bridgeless circuit which incorporates fast response filtering within the circuit itself. In the circuit of the invention, a very high value, high quality capacitor is placed in series with the test sample and a low frequency voltage is applied across the series circuit. The voltage across the high value series capacitor is then read by means of a very high impedance detector circuit. The specific values of capacitor and input impedance are selected by prescribed relationships to the capacitance range anticipated for the sample, to the stray capacitance to ground, and to the resistive component of the sample. A detector offset-current compensation circuit is also provided to adjust for D.C. voltage level drift in the high input impedance detector circuit, and the use of a high resistance series resistor in conjunction with the large series capacitor makes the time constant of the adjustment so large that it does not affect the sample measurement and can easily be computer controlled.

The series capacitor is selected to have a capacitance of the order of 1000 times as great as the anticipated capacitance of the sample to be measured. Typically, this puts the series capacitor in the range of 0.1 microfarads to 10 microfarads. However, the minimum value of the series capacitor is also determined by the leakage resistance of the sample. The size of the series capacitor is prescribed by the relationship that the leakage resistance of the sample should be at least 1000 times greater than the reactance of the series capacitor.

A further condition of the circuit configuration is that the input impedance of the voltage detector across the series capacitor must be several orders of magnitude larger than the reactance of the series capacitor at the frequency of the test. This condition assures that the current flowing through the sample is not affected in any way by the detector circuit itself.

All these conditions are essential to the measurement accuracy because they assure the voltage measurement across the series capacitor will be directly related to only the current through the sample and that changes in the measured voltage will only be controlled by changes in the sample itself over a wide range of properties. The important limitation is that, despite the fact that the test is made with very low frequency alternating current, no resistive element of any consequence is present to permit any change in phase shift due to change in frequency or change in resistance.

This assurance that the influence of resistive components will be incidental, at frequencies where resistive components are generally a major factor in the measuring circuits, is further accomplished by selection of a series capacitor of very high quality. In this context high quality means a capacitor with very low dielectric loss.

The circuit of the invention, by the use of high series capacitance and very high shunt resistance, results in a low impedance, with no perceptible phase shift influencing component, in series with the sample. The sample itself then determines the current in the circuit and the voltage reading across the series capacitor yeilds a true indication of that current, uninfluenced by stray capacitance or leakage resistance.

DETAILED DESCRIPTION OF THE INVENTION

Figure 1:
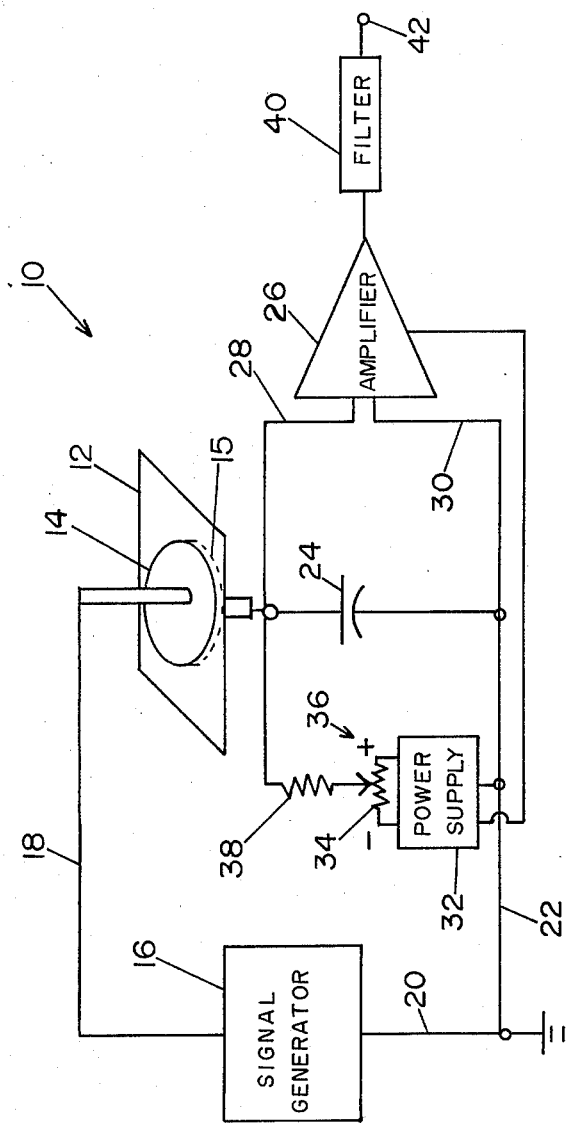
FIG. 1 is a simplified schematic diagram of the preferred embodiment showing the major components.

The preferred embodiment of the invention is shown in a simplified schematic diagram in FIG. 1 where test setup 10 is used to measure the dielectric properties of sample 12. Sample 12 is placed between electrodes 14 and 15 for testing. A typical sample is rigid polyvinyl chloride sheet 0.030 inches thick. The electrodes are standard ASTM guarded electrodes which are designed to compensate for stray and end effects.

An alternating current signal generator is used to supply low frequency signal, below 10 Hertz, which is the range of interest on the test. While higher frequencies are practical for the test circuit, the specific benefits of the invention are most apparent in the range of interest.

A typical signal generator appropriate for use in the test application is a Hewlett Packard Function Generator Model 3310A with up to 30 volts output at frequencies of 0.0005 Hz to 5 MHz.

One output connection of signal generator 16 is made directly to first electrode 14 by means of wire 18, while the other output connection of generator 16 is connected by means of wire 20 to ground line 22 which is also the common return for all other circuit components. Capacitor 24 is attached to test electrode 15 and ground line 22 to complete the basic test circuit with sample 12 and capacitor 24 in series across the output of signal generator 16.

The current through the series circuit of sample 12 and capacitor 24 thus produces a voltage across capacitor 24 which is monitored by buffer amplifier 26, connected across capacitor 24 by leads 28 and 30. This amplifier is required to be a very high input impedance, non-inverting, operational amplifier. An input impedance of greater than $10^{11}$ ohms is required for best results, as is described in the description of FIG. 2.

The typical high input impedance amplifier requires an offset-current compensating circuit 36 which consists of power supply 32 and potentiometer 34. Compensating circuit 36 permits the occasional adjustment of the D.C. level of amplifier input 28 between plus and minus 15 volts. The invention includes an improvement upon the typical D.C. level compensating circuit in that isolation resistor 38 is used in conjunction with capacitor 24 to increase the time constant of the adjustment. Isolation resistor 38 is required to have a very high resistance, $10^9$ ohms or greater, which, in conjunction with series capacitor 24, produces a time constant for the compensating adjustment several orders of magnitude longer than the period of the frequencies used for testing. This assures that adjustment of compensating circuit 36 will not affect the test reading. Moreover, the long time constant easily swamps out any extraneous noise which might otherwise be injected into the circuit through the compensating circuit.

Filter 40 is connected to the output of buffer amplifier 26 to aid on computer data analysis in some applications, but is not required in most instances. In typical applications a computer (not shown) is connected to output 42 to process the data generated by test setup 10. The computer essentially compares the voltage input of buffer amplifier 26 to the voltage output of signal generator 16 to derive the phase shift caused by sample 12. It also uses the amplifier input voltage and reactance of capacitor 24 at the test frequency to derive the current through sample 12. These readings are then interpreted to derive the dielectric properties of sample 12.

The properties of sample 12 which are determined by the apparatus and method of FIG. 1 are capacitance, conductance, permittivity, loss factor and dissipation factor. These parameters are measurable over long periods, with unattended operation of the test apparatus, so that they can be checked under varying environmental conditions such as changes in humidity or temperature.

For example, a 0.030 inch thick sheet of polyvinyl chloride was tested at various temperatures within the range of 50 degrees celsius to 80 degrees celsius, by slowly varying the temperature and processing the data derived from the apparatus of the invention by computer. The computer can also be used to automatically control the input D.C. level compensation of amplifier 26 by means of potentiometer 34.

In a typical test at 0.005 Hz, the polyvinyl chloride sample changed dramatically between 60 degrees and 65 degrees celsius. In that test, the capacitance increased from approximately 90 picofarads to 175 picofarads; the dielectric permittivity increased from 4 to 7.5; and the loss factor increased from 0.175 to 0.34 as the temperature was increased.

Figure 2:
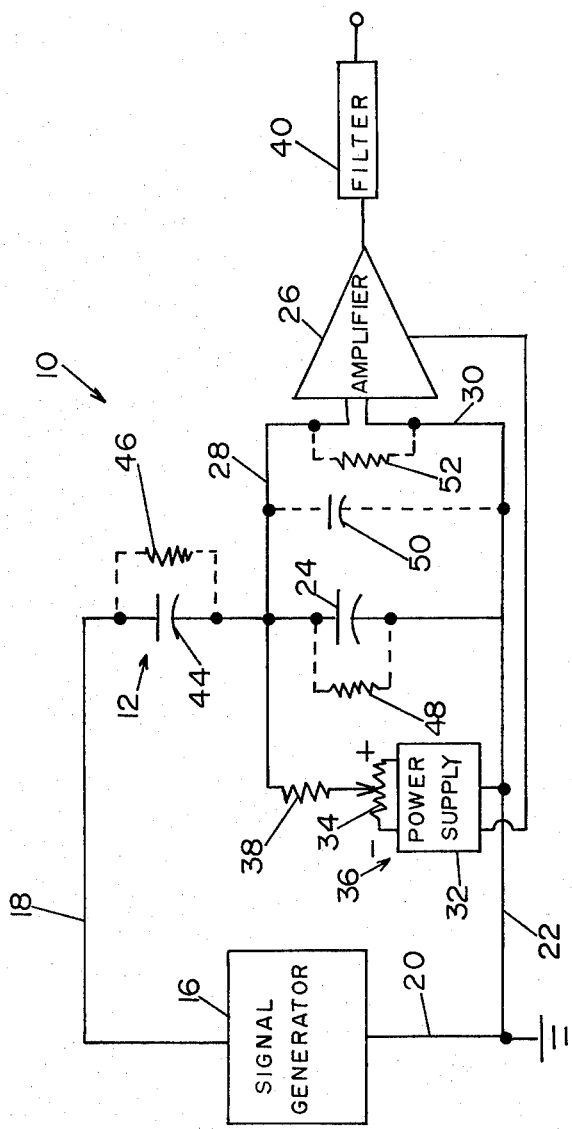
FIG. 2 is a simplified schematic diagram of the preferred embodiment showing the equivalent circuit of the sample, the stray capacitances and the leakage resistances.

The configuration of the invention is better understood by reference to FIG. 2 where stray capacitances and leakage resistances are depicted as components connected by dashed lines. Sample 12 is thus composed of capacitance 44 and leakage resistance 46, while series capacitor 24 has leakage resistance 48 associated with it. Another factor influencing design is stray capacitance 50 caused by line 28 and the components attached to it, including the input capacitance of amplifier 26. Amplifier 26 also has an effective input impedance which is best represented by resistance 52.

The selection of components for test setup 10 is essentially aimed at minimizing the effects of resistances 48 and 52, by maximizing the apparent values of these shunt resistances in order that the circuit takes on the characteristics of pure capacitance at the input of amplifier 26. However, the effects of stray capacitance 50 to ground must also be minimized because variations in stray capacitance 50 are a major source of microphonic noise.

These goals are accomplished in several ways. Sample leakage resistance 46 is, of course, a parameter being measured, and this test arrangement is valid as long as sample capacitance 44 is not negligible in comparison to leakage resistance 46.

Capacitor 24 is selected so that its reactance at the test frequency is of the order of 1/1000 the value of the leakage resistance of the sample.

While smaller orders of magnitude are usable, such as a factor of 1/100, the relationship is essentially one that determines error and to attain an influence of less than 0.1% by the leakage resistance 46, the factor of 1/1000 is desirable.

Another criterion for the selection of series capacitor 24 is that is should be much larger than the sample capacitance 44. Again, the order of magnitude of the difference determines the influence that variations in series capacitor 24 will have on the test results, so while a factor of 100 is a minimum for accurate results, a factor of 1000 or more is preferable.

Finally, the size of capacitor 24 must also take into account the effects of stray capacitance 50.

To assure that stray capacitance 50 does not cause error in the test results, series capacitor 24 must be at least 100 times larger than stray capacitance 50, and preferably 1000 times larger.

The selection of capacitor 24 is, however, also influenced by its own leakage resistance 48. Capacitor 24 must be of high quality so that its leakage resistance has no significant effect on the test. Again, a required factor is that leakage resistance 48 be at least 100 times larger, and preferably 1000 times larger, than the reactance of capacitor 24 at the test frequency.

One capacitor which has been found suitable for use in the test circuit described is the General Radio Model 1419B polystyrene decade capacitor.

Both resistor 38, the isolating resistor from compensating circuit 36, and amplifier input resistance 52 must also be selected to assure that they have no significant influence on the test. This requires that the shunt resistance across capacitor 24 because of these resistances be at least 100 times as great as the reactance of capacitor 24 at the test frequency.

A Victoreen Co. glass encapsulated high megohm resistor has been found satisfactory for isolating resistor 38. Satisfactory buffer amplifiers are generally available with input impedances up to $10^{11}$ ohms, and special designs have input impedance values up to $10^{17}$ ohms.

The use of such high impedance devices, and of a high quality series capacitor, makes the test circuit effectively purely capacitive. The use of high value capacity, despite the very low frequency of testing, counteracts the effects of the leakage resistance and overrides the effects of stray capacitance, thereby further assuring an accurate, noise-free and stable test method. Finally, the large series capacitor relative to the capacity of the test sample, assures that the sample itself will essentially be the only determinant of the electrical readings which are used to determine the dielectric characteristics of the sample.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

What is claimed as new and desired to be secured by Letters Patent of the United States is:

1. A method for measuring dielectric properties of a material sample at a frequency of less than 10 Hz., comprising:

selecting a series capacitor having a capacitance value at least 100 times the capacitance anticipated for the sample and at least 100 times the stray capacitance in parallel with the series capacitor; having a reactance at the testing frequency of no more than 1/100 of the anticipated leakage resistance of the sample; and having a leakage resistance of its own which is at least 100 times as great as its reactance at the testing frequency;

placing the material sample between test electrodes to form a test configuration;

connecting the series capacitor in series with the test configuration;

applying a test voltage of the testing frequency to the series circuit of the test configuration and the series capacitor; and reading the voltage across the series capacitor with a high input impedance measuring means whose input impedance is at least 100 times the reactance of the series capacitor at the testing frequency.

2. An apparatus for testing dielectric properties of a material sample at frequencies less than 10 Hz. comprising:

a signal generator producing a voltage at a testing frequency of less than 10 Hz.;

a test configuration comprising a material sample held between two test electrodes to form a circuit element, the first electrode of which is connected to a first output connector of the signal generator;

a series capacitor connected between a second output connector of the signal generator and the second electrode of the test configuration; said capacitor having a capacitance value at least 100 times the capacitance anticipated for the sample and at least 100 times the stray capacitance in parallel with the series capacitor; having a reactance at the testing frequency of no more than 1/100 of the anticipated leakage resistance of the sample; and having a leakage resistance of its own which is at least 100 times as great as its reactance at the testing frequency; and a high input impedance measuring means connected across the series capacitor, said measuring means having an input impedance at least 100 times the reactance of the series capacitor at the testing frequency.

3. An apparatus for testing dielectric properties of a material sample as in claim 2 wherein the measuring means includes a D.C. compensating circuit with an isolating resistor connected between the input of the measuring means and the compensating circuit, said isolating resistor having a value of resistance at least 100 times the value of the reactance of the series capacitor at the testing frequency.

4. An apparatus for testing dielectric properties of a material sample as in claim 2 wherein the capacitance of the series capacitor is at least 1000 times the capacitance anticipated for the sample.

5. An apparatus for testing dielectric properties of a material sample as in claim 2 wherein the capacitance of the series capacitor is at least 1000 times the stray capacitance in parallel with the series capacitor.

6. An apparatus for testing dielectric properties of a material sample as in claim 2 wherein the reactance of the series capacitor at the testing frequency is no more than 1/1000 of the anticipated leakage resistance of the sample.

7. An apparatus for testing dielectric properties of a material sample as in claim 2 wherein the leakage resistance of the series capacitor is at least 1000 times as great as its reactance at the testing frequency.

* * * * *